US008558567B2

(12) United States Patent
Mutnury et al.

(10) Patent No.: US 8,558,567 B2
(45) Date of Patent: Oct. 15, 2013

(54) IDENTIFYING A SIGNAL ON A PRINTED CIRCUIT BOARD UNDER TEST

(75) Inventors: Bhyrav M. Mutnury, Austin, TX (US);
Nam H. Pham, Round Rock, TX (US);
Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 12/780,333

(22) Filed: May 14, 2010

(65) Prior Publication Data

US 2011/0279138 A1 Nov. 17, 2011

(51) Int. Cl.
*G01R 31/20* (2006.01)
*G01R 19/00* (2006.01)

(52) U.S. Cl.
USPC .................. 324/754.01; 324/500; 324/754.07

(58) Field of Classification Search
None
See application file for complete search history.

(56) References Cited

U.S. PATENT DOCUMENTS

| | | |
|---|---|---|
| 5,471,136 A | 11/1995 | Pye |
| 5,574,668 A | 11/1996 | Beaty |
| 5,850,146 A | 12/1998 | Shim et al. |
| 6,118,288 A | 9/2000 | Kang |
| 7,598,725 B2 | 10/2009 | Bosy et al. |
| 8,373,429 B2 * | 2/2013 | Slupsky et al. .......... 324/754.31 |
| 2006/0164115 A1 | 7/2006 | Komiya et al. |

FOREIGN PATENT DOCUMENTS

| | | |
|---|---|---|
| JP | 61022268 A2 | 1/1986 |
| JP | 363117273 A | 5/1988 |

OTHER PUBLICATIONS

Allard et al., "Automatic Semiconductor Chip Electrical Test Probe Alignment System", IBM TDB 11-86 p. 2626-2627, Nov. 1, 1986, IP.com No. IPCOM000062402D.

* cited by examiner

*Primary Examiner* — Jermele M Hollington
*Assistant Examiner* — Trung Nguyen
(74) *Attorney, Agent, or Firm* — H. Barrett Spraggins; Cynthia G. Seal; Biggers & Ohanian, LLP.

(57) ABSTRACT

Identifying a signal on a printed circuit board ('PCB') under test, including a test probe with a radio transmitter and transmitter antenna, the test probe positioned with the transmitter antenna at a test point on the PCB, the test probe transmitting a radio signal; at least two radio receivers, each receiver having a receiver antenna, each receiver antenna positioned at predetermined, separate physical locations with respect to the PCB, the receivers coupled to at least one signal strength meter, each receiver receiving the transmitted radio signal; and a signal-identifying controller connected to the signal strength meter, the signal-identifying controller reading, from the signal strength meter, signal strengths of the transmitted radio signal as received at the radio receivers; determining, in dependence upon the read signal strengths, a test signal identifier; and displaying the test signal identifier.

9 Claims, 4 Drawing Sheets

IDENTIFYING A SIGNAL ON A PRINTED CIRCUIT BOARD UNDER TEST

BACKGROUND OF THE INVENTION

1. Field of the Invention

The field of the invention is data processing, or, more specifically, methods, apparatus, and products for identifying a signal on a printed circuit board ('PCB') under test.

2. Description of Related Art

A tester approaches a PCB with a test probe. The PCB has hundreds of vias accessible to the probe at test points on the PCB, the vias connecting through the laminate layers of the PCB to ball contacts in ball grid arrays ('BGAs') on one or more flip chips mounted somewhere on the PCB. The tester contacts a test point with the probe and turns to look at a test monitor, an oscilloscope display on which is now displayed the test signal from the test point on the PCB. Here's the problem: What signal is it? What signal does the tester expect to see on the monitor? To which pin on which integrated circuit package is the probe now connected? To which of the hundreds of conductors in fifteen layers of laminate in the PCB is the probe now connected? In high speed electrical lab validation, pins in a BGA or connectors are notoriously hard to identify and probe in a lab environment. The boards, the chip carriers, or the chips themselves, all described in detail in a Computer Aided Design ('CAD') file may be installed in the system in a different orientation than is shown in CAD file. The boards, the chip carriers, or the chips themselves may be flipped over or rotated, for better access. A chip package can have several hundred pins, spaced at a very narrow pitch, making it hard to keep track of the intended pin to be probed. A PCB that would otherwise have silkscreened signal identifiers silkscreened onto a surface of the PCB may have no space around a particular chip to insert silkscreen text, or silkscreened text may be covered by an overhanging heat sink or other component.

SUMMARY OF THE INVENTION

Methods, apparatus, and computer program products for identifying a signal on a printed circuit board ('PCB') under test, where the PCB includes electronic test points, the test points conducting test signals, including a test probe with a radio transmitter and transmitter antenna, the test probe positioned with the transmitter antenna at a test point on the PCB, the test probe transmitting a radio signal; at least two radio receivers, each receiver with a receiver antenna positioned at predetermined, separate physical locations with respect to the PCB, the receivers coupled to a signal strength meter, each receiver receiving the transmitted radio signal; and a signal-identifying controller connected to the signal strength meter and also connected to a display, the signal-identifying controller reading, from the signal strength meter, signal strengths of the transmitted radio signal as received at the radio receivers; determining, in dependence upon the read signal strengths, a test signal identifier; and displaying the test signal identifier through the display.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
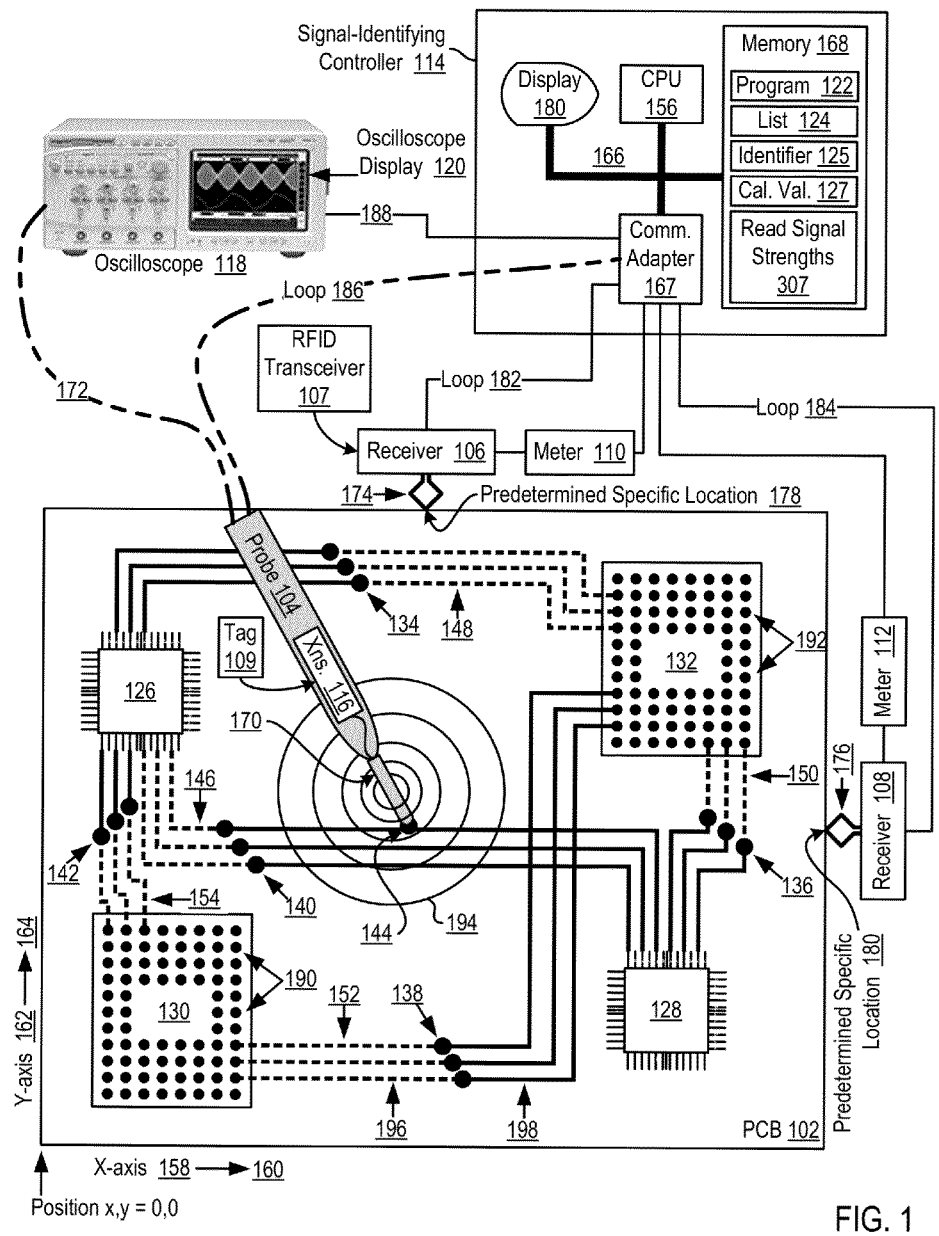
FIG. 1 sets forth a line drawing and functional block diagram of apparatus for identifying a signal on a PCB under test according to embodiments of the present invention.

Exemplary methods, apparatus, and products for identifying a signal on a PCB under test in accordance with the present invention are described with reference to the accompanying drawings, beginning with FIG. 1. FIG. 1 sets forth a line drawing and functional block diagram of apparatus for identifying a signal on a PCB (102) under test according to embodiments of the present invention. The PCB of FIG. 1 includes a number of electronic test points (134, 136, 138, 140, 142). At least some of the test points conduct test signals because one or more of the circuits (126, 128, 130, 132) has been placed in a test mode that generates test signals in test patterns on output pins of the circuit. The four circuits (126, 128, 130, 132) on the PCB are integrated circuits representing two kinds of integrated circuit packaging, two of the circuits (126, 128) are packaged in Thin Quad Flat Packs or 'TQFPs,' and the other two (130, 132) are in Ball Grid Array packages or 'BGAs.' Both TQFP and BGA are forms of surface-mount technology that support many pin connections from a chip through its package to conductors on and in a PCB. The TQFPs (126, 128) in this example are each 52-pin packages, and each BGA (130, 132) in this example is a 76-pin package. These are conservative examples only. Surface mount packages such as these can support many more external connections. Some BGAs have hundreds of pins in their arrays. The actual connection arrays (190, 192) in this example are shown, for ease of explanation, on the top of the BGA packages (130, 132); readers will recognize that in an actual installation, the balls in a Ball Grid Array are positioned under the package, between the package and the top surface of the PCB, where they would not be visible as they are here.

Figure 2:
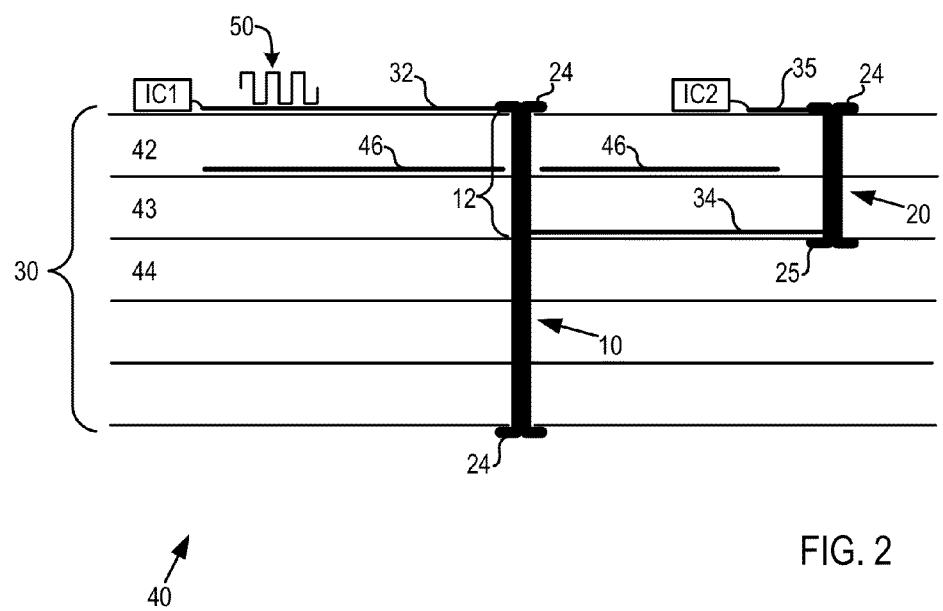
FIG. 2 sets forth a cross-sectional plan view of an example multi-layer PCB illustrating features of the kind of PCB typically under test by apparatus for identifying a signal on a PCB according to embodiments of the present invention.

It is said that pin conductors of a PCB are both on and in a PCB because PCBs are typically manufactured with multiple layers of laminate and conductors. For further explanation, FIG. 2 sets forth a cross-sectional plan view of an example multi-layer PCB (40) illustrating features of the kind of PCB typically under test by apparatus for identifying a signal on a PCB according to embodiments of the present invention. The example PCB in FIG. 2 includes layers of laminate (30), several conductors among the layers of laminate, and two vias (10, 20) traversing layers of laminate. The vias are composed of conductive material disposed in holes drilled through layers of laminate. Vias generally are used as electrical conductors through the layers of laminate, connected to conductors in the layers, conductors such as signal lines, ground planes, ground lines, power planes, power lines, and so on. The tops of vias (10, 20) and the bottom of via (20) here are formed into contact pads (24) that are used as test points in apparatus for identifying a signal on a PCB according to embodiments of the present invention. Via (20) also has a bottom pad (25), but it is buried inside the laminate and cannot be reached by a probe for use as a test point. In the example of FIG. 2, via (10) conducts an alternating current signal (50) from integrated circuit IC1 and a conductive trace (32) on the top layer (42) of the PCB to a trace (34) on an internal layer (44) of the PCB. Via (10) conducts the signal (50) through the top portion (12) of via (10) to trace (34), and the signal then travels through via

(20) and trace (35) to integrated circuit IC2. The conductors in the laminate in the example PCB of FIG. 2 include a ground plane (46) disposed upon the second layer (43) of laminate. The structure of PCB (40) are simplified for ease of explanation; readers will recognize that PCB under test by apparatus for identifying signals on a PCB according to embodiments of the present invention typically will have, not just one or two, but many signal traces, many vias, and many test points. In addition, such PCBs will include not just four or five layers of laminate, but ten layers, twenty layers, or more.

Again referring to FIG. 1: The example PCB (102) of FIG. 1 includes five sets of signal traces (146, 148, 150, 152, 154). PCB (102) is a multi-layer PCB, and the signal traces (146, 148, 150, 152, 154) are disposed upon various laminate layers of PCB (102), which is not visible in FIG. 2 because PCB (102) is illustrated in top view only. The fact that the signal traces are disposed upon various levels of PCB (20), therefore, is commemorated by illustrating the traces partly with dotted lines (196) and partly with dotted lines (198). Transitions from dotted to solid occur at test points (134, 136, 138, 140, 142), where the traces change layers and are brought out to the top layer through vias, where the traces can be accessed with a test probe.

The example apparatus of FIG. 2 includes a test probe (104). The test probe includes a radio transmitter (116) and transmitter antenna (170). The transmitter (116) is a small, low power device composed, for example, of a radio frequency oscillator with an output connected to the antenna (190), optimally including a small output amplifier with a gain control. The antenna (170) is implemented in this example as a conductive probe tip. The test probe is positioned with the transmitter antenna at a test point (144) on the PCB. The test probe transmits a radio signal (194).

The example apparatus of FIG. 2 also includes at least two radio receivers (106m 108) that receive the transmitted radio signal (194). The receivers, like the transmitter, are small, low-power devices, also optionally including an output amplifier with a gain control. In an embodiment the receivers are receive-only devices, and the transmitter is a transmit-only device. In other embodiments, the receivers are Radio Frequency Identification ('RFID') transceivers (107), and the transmitter (116) is the transmitter portion of an RFID tag (109) with which the probe is fitted instead of a transmit-only device. Radio-frequency identification in such embodiments uses an object, called an RFID tag, incorporated into a probe in and operated in conjunction with RFID transceivers, also referred to as 'interrogators' or 'readers.' Many RFID tags have form factors so small as to be easy to integrate into a probe. In typical usage, an RFID transceiver interrogates an RFID tag to retrieve information stored in the tag. In apparatus that identifies PCB signals according to embodiments of the present invention, the receivers (106, 108), that is, the receiver portions of RFID transceivers, would have no interest in anything stored in the RFID tag, being interested instead only in the strength of the signal returned by the RFID tag (109, 116) when interrogated. Such an RFID tag (109) typically is an integrated circuit that stores and processes information, modulating and demodulating a radio-frequency signal, sometimes including other specialized functions. The RFID tag can be battery powered for stronger signal strength, or the tag can be passive, no battery, requiring an external source to provoke signal transmission, e.g., an interrogation from an RFID transceiver (107).

It is said that the example apparatus of FIG. 2 includes 'at least two' radio receivers (106, 108) because apparatus that identifies signals on PCBs according to embodiments of the present invention optionally includes more than two receivers, although it needs at least two, and in the particular example of FIG. 2, there are just two receivers (106, 108). Each receiver (106, 108) includes a receiver antenna (174, 176). The antennas here are represented as simple loop antennas (174, 176), although other forms of antenna are feasible, dipoles, lines, and so on. The antennas are shown here with the receivers adjacent to but separate from the PCB (102), but the receivers could be built into integrated circuits and installed on the PCB itself.

Each receiver antenna is, however, positioned at predetermined, separate physical locations (178, 180) with respect to the PCB. The predetermined, separate physical locations enable a determination of the location of the probe. PCB (102) can be viewed in accordance with x,y coordinates, originating at the bottom left of the PCB at position x,y=0,0, with x values increasing in direction (160) and y values increasing in direction (164). With the receiver antennas (174, 176) positioned as they are, and with a steady signal strength output from the transmitter (116) in the probe (104), then the strength of the signal received at antenna (174) increases as the probe is moved up on the Y-axis, from the bottom of the board toward the top, and the strength of the signal received at antenna (174) decreases as the probe is moved down on the Y-axis, from the top of the board toward the bottom. Similarly, the strength of the signal received at antenna (176) increases as the probe is moved up on the X-axis, from the left of the board toward the right, and the strength of the signal received at antenna (176) decreases as the probe is moved down on the X-axis, from the right of the board toward the left. Two signal strength values, therefore, can identify any location of the probe on the PCB. The receivers (106, 108) are coupled to at least one signal strength meter. Actually, in this example, there are two signal strength meters (110, 112), one for each receiver separately. It is said 'at least one' because, alternatively, one, more complex meter could be automated to digitally sample signal output from both receivers, or one meter could be switched between the receivers.

The example apparatus of FIG. 2 also includes a signal-identifying controller (114), which is a module of automated computing machinery. The signal-identifying controller (114) is represented in this example as a separate component, although it is in other embodiments integrated into one of the receivers, or integrated into a test scope (118), or implemented in an integrated circuit and mounted on the PCB with connections through signal traces to other components on the board, integrated into the probe (104) itself, or implemented in other ways as will occur to those of skill in the art. The signal-identifying controller (114) in this example is represented as having a computer processor or 'CPU' (156) connected through a system bus (166) to a computer memory (168) bearing a control program (122), a built-in display (180), and a communications adapter (167). In other embodiments, as a module of automated computing machinery, the signal-identifying controller (114) can be implemented as a microcontroller with a Harvard architecture, as a Complex Programmable Logic Device ('CPLD'), as a Field Programmable Gate Array ('FPGA'), as an Application Specific Integrated Circuit ('ASIC'), entirely as hardware, a combination of hardware and software, and in other ways as will occur to those of skill in the art. In the particular example of FIG. 1, the control program (122) is composed of computer program instructions that operate the CPU (156), a computer processor or microcontroller, to identify signals on the PCB according to embodiments of the present invention.

The signal-identifying controller (114) is connected to the signal strength meters (110, 112) and also connected to a display, actually, in the example of FIG. 1, two displays, an integrated display (180) and an oscilloscope display (120). The scope connection (188, 118, 120) is preferred, because by its use signals can be both displayed and identified on the same screen at the same time, but other embodiments can include a small display such as a Liquid Crystal Display ('LCD'), for example, on the signal-identifying controller (114). In an embodiment with the signal-identifying controller (114) integrated in to a probe, for example, a user can place the probe at a test point on the PCB and read from a display on the probe itself the identity of the signal at that test point. The signal-identifying controller (114) functions by reading, from the signal strength meters (110, 112), signal strengths (307) of the transmitted radio signal (194) as received at the radio receivers (106, 108). The signal-identifying controller (114) then determines, in dependence upon the read signal strengths (307), a test signal identifier (125), that is, information representing the identity of the signal present at the test point where the probe is positioned. The signal-identifying controller (114) then displays the test signal identifier through a display.

In the particular example embodiment of FIG. 1, the signal-identifying controller (114) includes in its memory (168) a list (124) of signal strengths associated with test signal identifiers, and the signal-identifying controller (114) determines a test signal identifier by using signal strength values to look up a test signal identifier (125) in the list (124), a process explained further with reference to Table 1.

TABLE 1

Signal Strengths And Test Signal Identifiers

| Signal Strengths (μv) | | Test Signal Identifiers | | |
|---|---|---|---|---|
| X Value | Y Value | Component Name | Pin Name | Signal Name |
| 100 | 50 | Pentium ™ | AK08 | A20M# |
| 120 | 75 | Pentium ™ | AJ05 | ADS# |
| 130 | 125 | Pentium ™ | AM02 | ADSC# |
| 140 | 430 | Pentium ™ | V04 | AHOLD |
| 150 | 220 | Pentium ™ | AK02 | AP |
| 160 | 175 | Pentium ™ | AE05 | APCHK# |
| 170 | 330 | Pentium ™ | AL09 | BE0# |
| 180 | 270 | Pentium ™ | AK10 | BE1# |
| 190 | 90 | Pentium ™ | AL11 | BE2# |
| 200 | 140 | Pentium ™ | AL12 | BE3# |
| ... | ... | ... | ... | ... |
| ... | ... | ... | ... | ... |
| ... | ... | ... | ... | ... |

Table 1 is an example embodiment of a list (124) of signal strengths associated with test signal identifiers. Each row in Table 1 represents an association of signal strengths with test signal identifiers. The values in the X Value and Y Value columns are signal strengths that are associated with particular test signal identifiers in the Component Name, Pin Name, and Signal Name columns. Examples of test signal identifiers include component names, pin names, signal names, schematic symbol names, and others that will occur to those of skill in the art. The X-direction signal strength values in the first column of Table 1 represent values read by the signal-identifying controller (114) from receiver (108) through signal strength meter (112), and the Y-direction signal strength values in the second column of Table 1 represent values read by the signal-identifying controller (114) from receiver (106) through signal strength meter (110). Table 1 includes ten examples of associations of signal strengths with particular test signal identifiers, which function to identity signals on a PCB as follows:

The probe (104) is positioned at a test point, transmitting its radio signal whose signal strengths at the radio receivers (108, 106) are read by the signal-identifying controller (114) as 100 and 50 microvolts respectively. The signal-identifying controller (114) looks up the identifiers in Table 1 for those signal strength values as Component Name="Pentium™," signifying that the signal available at that test point comes from an Intel Pentium™ processor package on the PCB, Pin Name="AK08," and Signal Name="A20M#," the masking signal for physical address bit 20.

The probe (104) is positioned at a test point, transmitting its radio signal whose signal strengths at the radio receivers (108, 106) are read by the signal-identifying controller (114) as 120 and 75 microvolts respectively. The signal-identifying controller (114) looks up the identifiers in Table 1 for those signal strength values as Component Name="Pentium™," signifying that the signal available at that test point comes from an Intel Pentium™ processor package on the PCB, Pin Name="AJ05," and Signal Name="ADS#," the address strobe signal.

The probe (104) is positioned at a test point, transmitting its radio signal whose signal strengths at the radio receivers (108, 106) are read by the signal-identifying controller (114) as 130 and 125 microvolts respectively. The signal-identifying controller (114) looks up the identifiers in Table 1 for those signal strength values as Component Name="Pentium™," signifying that the signal available at that test point comes from an Intel Pentium™ processor package on the PCB, Pin Name="AM02," and Signal Name="ADSC#," the address strobe copy signal.

The probe (104) is positioned at a test point, transmitting its radio signal whose signal strengths at the radio receivers (108, 106) are read by the signal-identifying controller (114) as 140 and 430 microvolts respectively. The signal-identifying controller (114) looks up the identifiers in Table 1 for those signal strength values as Component Name="Pentium™," signifying that the signal available at that test point comes from an Intel Pentium™ processor package on the PCB, Pin Name="V04," and Signal Name="AHOLD," the address hold signal.

The probe (104) is positioned at a test point, transmitting its radio signal whose signal strengths at the radio receivers (108, 106) are read by the signal-identifying controller (114) as 120 and 75 microvolts respectively. The signal-identifying controller (114) looks up the identifiers in Table 1 for those signal strength values as Component Name="Pentium™," signifying that the signal available at that test point comes from an Intel Pentium™ processor package on the PCB, Pin Name="AK02," and Signal Name="AP," the address parity signal.

And so on . . . .

For ease of explanation, Table 1 includes only ten examples of associations of signal strengths with particular test signal identifiers, but readers will recognize that actual lists of associations of signal strengths with test signal identifiers often will contain many more such associations. The example implementation of a list of associations of signal strengths with test signal identifiers as Table 1 also is only for ease of explanation, not a limitation of the present invention. A list of associations of signal strengths with test signal identifiers can be implemented as a linked list in computer memory, an array, a C-style structure or 'struct', an array of structures, and so on.

In the example apparatus of FIG. 1, the signal-identifying controller (114) is configured with a predetermined calibration value (127) that represents a predetermined calibration power of the radio signal (194) as transmitted by the probe's transmitter (116). The transmitter signal's power level is calibrated by first positioning the test probe with the transmitter antenna at a predetermined calibration test point on the PCB. The signal identifying controller (114) then calibrates the transmitted radio signal (194) by adjusting the transmitted radio signal to a predetermined calibration power, that is, a power that causes at least one of the readings from the meters (110, 112) to match the predetermined calibration value (127). The adjustment is carried out through a feedback loop (186) between the signal-identifying controller (114) and the radio transmitter (116), connecting the signal-identifying controller to a gain control (not shown) of the transmitter (116).

An alternative calibration methodology is to calibrate the receiver gain instead of transmitter gain: The configured predetermined calibration value (127) is taken to represent a predetermined calibration signal strength (307) as read by the signal-identifying controller (114) from the meters (106, 108). The receivers' gain levels are calibrated by first positioning the test probe with the transmitter antenna at a predetermined calibration test point on the PCB. The signal identifying controller (114) then calibrates the receiver gains by adjusting the receiver gains to a level a power that produces readings from the meters (110, 112) that match the predetermined calibration value (127). The adjustment is carried out through feedback loops (182, 184) between the signal-identifying controller (114) and the receivers (106, 108), connecting the signal-identifying controller to gain controls (not shown) of the receivers.

Figure 3:
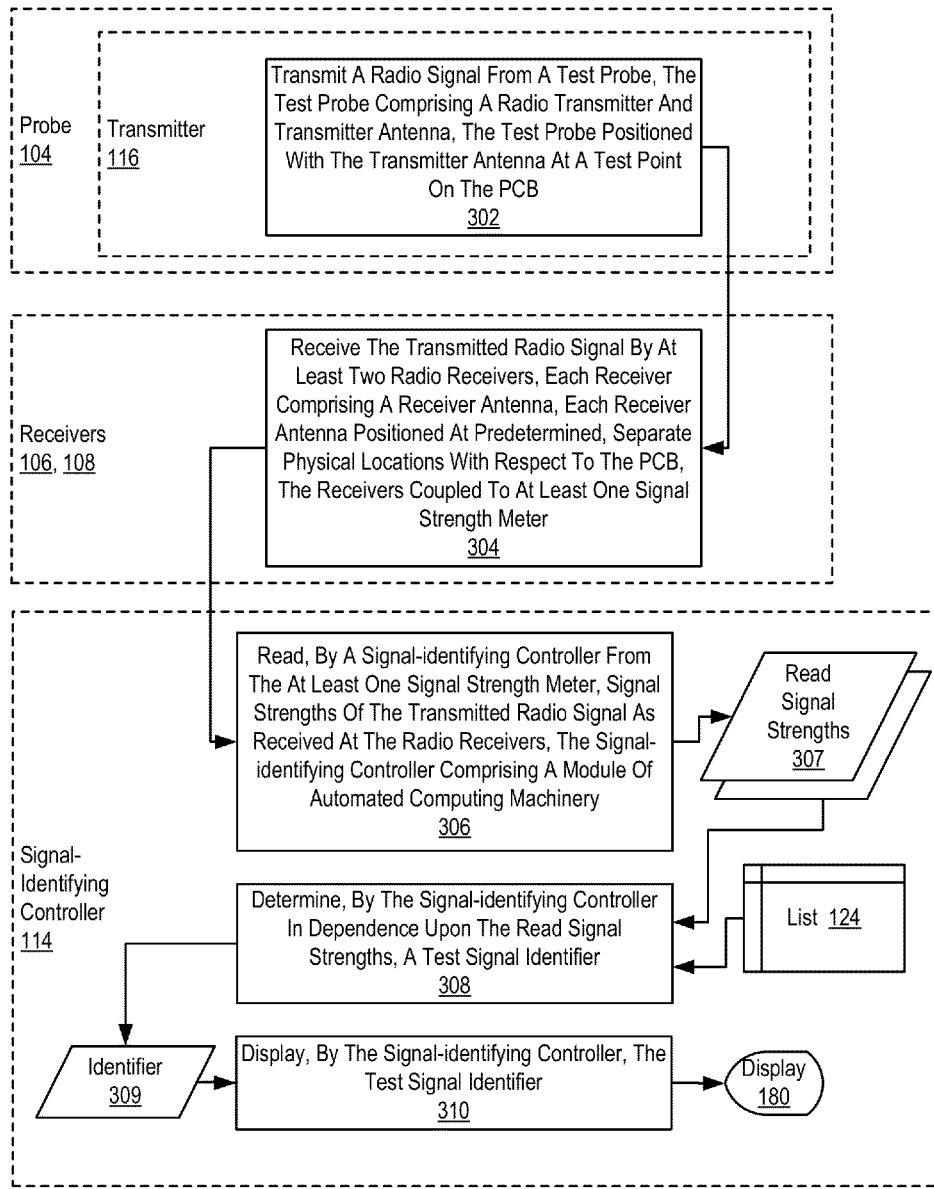
FIGS. 3-4 set forth flow charts illustrating example methods of identifying a signal on a PCB under test according to embodiments of the present invention.

For further explanation, FIG. 3 sets forth a flow chart illustrating an example method of identifying a signal on a PCB (102) under test according to embodiments of the present invention. The method of FIG. 3 is implemented by and with apparatus like that described and illustrated above with reference to FIG. 1. The method of FIG. 3, therefore, is described here with reference both to FIG. 1 and with reference to FIG. 3, using reference numbers from both FIGS. 1 and 3. The method of FIG. 3 includes transmitting (302) a radio signal (194) from a test probe (104). The test probe (104) includes a radio transmitter (116) and transmitter antenna (170), and the test probe is positioned with the transmitter antenna at a test point (144) on the PCB (102). The method of FIG. 3 also includes receiving (304) the transmitted radio signal (194) by at least two radio receivers (106, 108). Each receiver includes a receiver antenna (174, 176), and each receiver antenna is positioned at predetermined, separate physical locations (178, 180) with respect to the PCB. The receivers are also coupled to at least one signal strength meter (110, 112).

The method of FIG. 3 also includes reading (306), by a signal-identifying controller (114) from the at least one signal strength meter (110, 112), signal strengths (307) of the transmitted radio signal (104) as received at the radio receivers (106, 108). The method of FIG. 3 also includes determining (308), by the signal-identifying controller (114) in dependence upon the read signal strengths (307), a test signal identifier (309). In the example of FIG. 3, the signal-identifying controller (114) includes a list (124) of signal strengths associated with test signal identifiers and determining (308) a test signal identifier is carried out by using the read signal strengths (307) to look up a test signal identifier (309) in the list (124). The test signal identifier is implemented as, for example, some combination of a component name, a pin name, a schematic symbol name, a signal name, and the like. The method of FIG. 3 also includes displaying (310, 180, 188, 120), by the signal-identifying controller (114), the test signal identifier (309).

Figure 4:
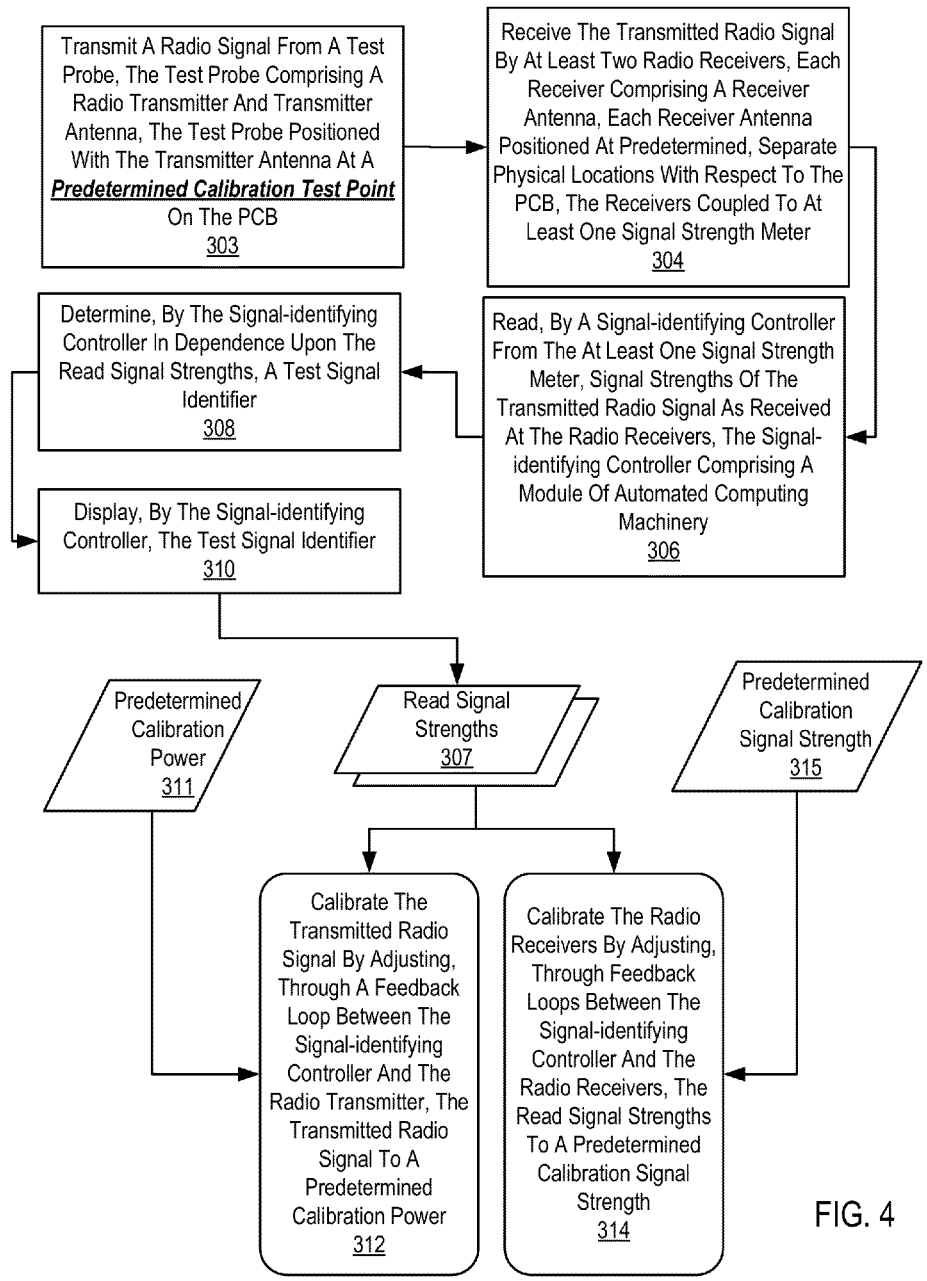

For further explanation, FIG. 4 sets forth a flow chart illustrating a further example method of identifying a signal on a PCB under test according to embodiments of the present invention. The method of FIG. 4 is similar to the method of FIG. 3, including as it does transmitting (303) a radio signal from a test probe, receiving (304) the signal by radio receivers, reading signal strengths (306), determining (308) a test signal identifier, and displaying (310) the test signal identifier. The transmitting step (303) in the method of FIG. 4, however, differs from the transmitting step (302) in the method of FIG. 3, and the method of FIG. 4 further differs from the method of FIG. 3 by including two additional calibration steps (312, 314). The method of FIG. 4, like the method of FIG. 3, is described here with reference both to FIG. 4 and also to FIG. 1, using reference numbers from both drawings.

In the transmitting step (302) in the method of FIG. 3, the probe is positioned at a test point that is any test point on the PCB. In the transmitting step (303) in the method of FIG. 4, however, the probe is positioned at a single particular test point, a predetermined calibration test point on the PCB, such as, for example test point (144). With the probe so positioned, the method of FIG. 4 then includes two alternative ways of calibrating apparatus that identifies signals according to embodiments of the present invention. In one alternative, the method of FIG. 4 includes calibrating (312) the transmitted radio signal (194) by adjusting, through a feedback loop (186) between the signal-identifying controller (114) and the radio transmitter (116), the transmitted radio signal to a predetermined calibration power (311). In another alternative, the method of FIG. 4 includes calibrating (314) the radio receivers (106, 108) by adjusting, through feedback loops (182, 184) between the signal-identifying controller (114) and the radio receivers, the read signal strengths (307) to a predetermined calibration signal strength (315).

Example embodiments of the present invention are described largely in the context of a fully functional computer system for identifying a signal on a PCB under test. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, that is as apparatus, or as a method or a computer program product. Accordingly, aspects of the present invention may take the form of an entirely hardware embodiment, embodiments that are at least partly software (including firmware, resident software, micro-code, etc.), with embodiments combining software and hardware aspects that may generally be referred to herein as a "circuit," "module," "apparatus," or "system." Furthermore, aspects of the present invention may take the form of a computer program product embodied in one or more computer readable media having computer readable program code embodied thereon.

Any combination of one or more computer readable media may be utilized. A computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in a flowchart or block diagram may represent a module, segment, or portion of code or other automated computing machinery, which comprises one or more executable instructions or logic blocks for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of identifying a signal on a printed circuit board ('PCB') under test, the method comprising:
   transmitting a radio signal from a test probe, the test probe comprising a radio transmitter and transmitter antenna, the test probe positioned with the transmitter antenna at a test point on the PCB;
   receiving the transmitted radio signal by at least two radio receivers, each receiver comprising a receiver antenna, each receiver antenna positioned at predetermined, separate physical locations with respect to the PCB, the receivers coupled to at least one signal strength meter;
   reading, by a signal-identifying controller from the at least one signal strength meter, signal strengths of the transmitted radio signal as received at the radio receivers, the signal-identifying controller comprising a module of automated computing machinery;
   determining, by the signal-identifying controller in dependence upon the read signal strengths, a test signal identifier, wherein the signal-identifying controller further comprises a list of signal strengths associated with test signal identifiers, and determining a test signal identifier further comprises looking up, by the signal-identifying controller in the list, a test signal identifier; and displaying, by the signal-identifying controller, the test signal identifier.

2. The method of claim 1 wherein the test signal identifier comprises one or more of: a component name, a pin name, a schematic symbol name, and a signal name.

3. The method of claim 1 wherein the radio receivers further comprise Radio Frequency Identification ('RFID') transceivers, and the probe further comprises an RFID tag.

4. Apparatus for identifying a signal on a printed circuit board ('PCB') under test, the PCB comprising a plurality of electronic test points, a plurality of the test points characterized by a conducting of test signals, the apparatus comprising:

a test probe comprising a radio transmitter and transmitter antenna, the test probe positioned with the transmitter antenna at a test point on the PCB, the test probe transmitting a radio signal;

at least two radio receivers, each receiver comprising a receiver antenna, each receiver antenna positioned at predetermined, separate physical locations with respect to the PCB, the receivers coupled to at least one signal strength meter, each receiver receiving the transmitted radio signal; and a signal-identifying controller comprising a module of automated computing machinery, the signal-identifying controller connected to the at least one signal strength meter and also connected to a display, the signal-identifying controller reading, from the at least one signal strength meter, signal strengths of the transmitted radio signal as received at the radio receivers; determining, in dependence upon the read signal strengths, a test signal identifier; and displaying the test signal identifier through the display, wherein the signal-identifying controller further comprises a list of signal strengths associated with test signal identifiers, and determining a test signal identifier further comprises looking up a test signal identifier in the list.

5. The apparatus of claim 4 wherein the test signal identifier comprises one or more of: a component name, a pin name, a schematic symbol name, and a signal name.

6. The apparatus of claim 4 wherein the radio receivers further comprise Radio Frequency Identification ('RFID') transceivers, and the probe further comprises an RFID tag.

7. A computer program product for identifying a signal on a printed circuit board ('PCB') under test, the computer program product disposed upon a computer readable storage medium, the computer program product comprising computer program instructions capable, when executed, of causing an automated signal-identifying controller to function by:

reading, from at least one signal strength meter, signal strengths of a transmitted radio signal as received from a test probe by at least two radio receivers, the test probe comprising a radio transmitter and transmitter antenna, the test probe positioned with the transmitter antenna at a test point on the PCB, each receiver comprising a receiver antenna, each receiver antenna positioned at predetermined, separate physical locations with respect to the PCB, the receivers coupled to the least one signal strength meter;

determining, in dependence upon the read signal strengths, a test signal identifier, wherein the signal-identifying controller further comprises a list of signal strengths associated with test signal identifiers, and determining a test signal identifier further comprises looking up a test signal identifier in the list; and displaying the test signal identifier.

8. The computer program product of claim 7 wherein the test signal identifier comprises one or more of: a component name, a pin name, a schematic symbol name, and a signal name.

9. The computer program product of claim 7 wherein the radio receivers further comprise Radio Frequency Identification ('RFID') transceivers, and the probe further comprises an RFID tag.

* * * * *